(12) United States Patent
Saèd

(10) Patent No.: US 7,409,193 B2
(45) Date of Patent: Aug. 5, 2008

(54) PREDISTORTION CIRCUIT FOR A TRANSMIT SYSTEM

(75) Inventor: Aryan Saèd, Ottawa (CA)

(73) Assignee: Zarbana Digital Fund LLC, Wilmington, DE (US)

(*) Notice: Subject to any disclaimer, the term of this patent is extended or adjusted under 35 U.S.C. 154(b) by 801 days.

(21) Appl. No.: 10/641,370

(22) Filed: Aug. 13, 2003

(65) Prior Publication Data
US 2005/0003770 A1    Jan. 6, 2005

Related U.S. Application Data

(63) Continuation-in-part of application No. 10/613,355, filed on Jul. 3, 2003.

(51) Int. Cl.
  H04B 1/04    (2006.01)
  H04B 17/02   (2006.01)
  H03D 5/00    (2006.01)

(52) U.S. Cl. .................. 455/114.3; 455/115.1; 455/137; 455/143; 375/296; 330/107; 330/136; 330/149

(58) Field of Classification Search .............. 455/114.3, 455/115.1, 118, 120, 126, 137, 143, 291, 455/293, 341; 330/84, 107, 136, 149, 280
See application file for complete search history.

(56) References Cited

U.S. PATENT DOCUMENTS

| | | | |
|---|---|---|---|
| 5,650,758 A | 7/1997 | Xu et al. | |
| 5,699,383 A | 12/1997 | Ichiyoshi | |
| 5,880,633 A | 3/1999 | Leizerovich | |
| 5,990,738 A | 11/1999 | Wright et al. | |
| 6,043,707 A | 3/2000 | Budnik | |
| 6,054,896 A | 4/2000 | Wright et al. | |

(Continued)

FOREIGN PATENT DOCUMENTS

EP    0930699    7/1999

(Continued)

OTHER PUBLICATIONS

Michael Faulkner; Adaptive Linearization Using Predistortion—Experimental Results, IEEE Transactions on Vehicular Technology; May 1994; pp. 323-332; vol. 43, No. 2.

(Continued)

*Primary Examiner*—Tony T. Nguyen
(74) *Attorney, Agent, or Firm*—Stolowitz Ford Cowger LLP

(57) ABSTRACT

Systems and methods related to amplifier systems which use a predistortion subsystem to compensate for expected distortions in the system output signal. A signal processing subsystem receives an input signal and decomposes the input signal into multiple components. Each signal component is received by a predistortion subsystem which applies a predistortion modification to the component. The predistortion modification may be a phase modification, a magnitude modification, or a combination of both and is applied by adjusting the phase of the fragment. The predistorted component is then separately processed by the signal processing subsystem. The processing may take the form of phase modulation and amplification. The phase modulated and amplified components are then recombined to arrive at an amplitude and phase modulated and amplified output signal. The predistortion modification is applied to the components to compensate for distortions introduced in the signal by the signal processing subsystem.

36 Claims, 4 Drawing Sheets

U.S. PATENT DOCUMENTS

| | | | |
|---|---|---|---|
| 6,072,364 A | 6/2000 | Jeckeln et al. | |
| 6,075,412 A | 6/2000 | Bainvoll | |
| 6,141,390 A | 10/2000 | Cova | |
| 6,147,553 A | 11/2000 | Kolanek | |
| 6,208,207 B1 | 3/2001 | Cavers | |
| 6,211,733 B1 | 4/2001 | Gentzler | |
| 6,215,354 B1 | 4/2001 | Kolanek et al. | |
| 6,246,286 B1 | 6/2001 | Persson | |
| 6,342,810 B1 | 1/2002 | Wright et al. | |
| 6,388,518 B1 | 5/2002 | Miyalani | |
| 6,734,731 B2 | 5/2004 | Cavers et al. | |
| 6,737,914 B2 | 5/2004 | Gu | |
| 6,836,183 B2 * | 12/2004 | Wight | 330/124 R |
| 6,904,267 B2 | 6/2005 | Hongo et al. | |
| 6,940,916 B1 | 9/2005 | Warner et al. | |
| 6,943,627 B2 | 9/2005 | Leyonhjelm et al. | |
| 6,975,167 B2 * | 12/2005 | Saed | 330/149 |
| 6,980,604 B2 | 12/2005 | Kubo et al. | |
| 6,985,704 B2 | 1/2006 | Yang et al. | |
| 7,015,752 B2 | 3/2006 | Saed | |
| 7,026,871 B2 | 4/2006 | Saed | |
| 7,026,872 B2 | 4/2006 | Saed | |
| 7,034,613 B2 | 4/2006 | Saed | |
| 7,068,101 B2 | 6/2006 | Saed et al. | |
| 7,127,005 B2 | 10/2006 | Wight | |
| 2001/0054974 A1 | 12/2001 | Wright | |
| 2002/0034260 A1 | 3/2002 | Kim | |
| 2002/0047745 A1 | 4/2002 | Kolanek | |
| 2002/0101937 A1 | 8/2002 | Antonio et al. | |
| 2002/0159532 A1 | 10/2002 | Wight | |
| 2005/0001677 A1 * | 1/2005 | Saed | 330/149 |
| 2005/0001678 A1 * | 1/2005 | Saed | 330/149 |
| 2005/0162225 A1 | 7/2005 | Suzuki et al. | |

FOREIGN PATENT DOCUMENTS

| | | |
|---|---|---|
| EP | 1170858 | 1/2002 |
| EP | 1 313 278 | 5/2003 |
| WO | WO 01/05026 | 1/2001 |
| WO | WO 01/56146 | 8/2001 |

OTHER PUBLICATIONS

Birafane et al; Phase-Only Predistorion for LINC Amplifiers with Chireix-Outphasing Combiners; Jun. 6, 2005; IEEE Transactions on Microwave Theory and Techniques, vol. 53, Issue 6, Part 2, pp. 2240-2250.

Cox, Linear Amplification with Nonlinear Components, Dec. 1974, IEEE Transactions on Communications, vol. 12, Issue 12, pp. 1942-1945.

* cited by examiner

PREDISTORTION CIRCUIT FOR A TRANSMIT SYSTEM

The present application is a continuation-in-part of U.S. patent application Ser. No. 10/613,355 filed Jul. 3, 2003.

FIELD OF THE INVENTION

The present invention relates generally to power amplification systems and is specifically applicable but not limited to power amplification systems using a Chireix architecture.

BACKGROUND OF THE INVENTION

The recent revolution in communications has caused a renewed focus on wireless technology based products. Mobile telephones, handheld computers, and other devices now seamlessly communicate using wireless technology. One component that forms the core of such technology is the amplifier. Wireless devices require high efficiency amplifiers to not only extend the range of their coverage but also to conserve the limited battery power that such devices carry.

One possible architecture which may be used for such a power amplifier is called a Chireix architecture. Named after Henry Chireix who first proposed such an architecture in the 1930s, the Chireix architecture has fallen out of favor due to its seemingly inherent limitations. However, it has recently been revisited as it provides some advantages that other architectures do not have.

While the Chireix architecture provides some advantages, the process which the input signal undergoes also introduces some drawbacks. Specifically, distortions are introduced into the signal by the components in the Chireix based amplifier/modulator system.

Based on the above, there is therefore a need for an amplifier system which provides the benefits of a Chireix based amplifier but which also compensates for or avoids the distortions which a Chireix based amplifier introduces. It is therefore an object of the present invention to provide alternatives which mitigate if not overcome the disadvantages of the prior art.

SUMMARY OF THE INVENTION

The present invention provides systems and methods related to amplifier systems which use a predistortion subsystem to compensate for expected distortions in the system output signal. A signal processing subsystem receives an input signal and decomposes the input signal into multiple components. Each signal component is received by a predistortion subsystem which applies a predistortion modification to the component. The predistortion modification may be a phase modification, a magnitude modification, or a combination of both and is applied by adjusting the phase of the fragment. The predistorted component is then separately processed by the signal processing subsystem. The processing may take the form of phase modulation and amplification. The phase modulated and amplified components are then recombined to arrive at an amplitude and phase modulated and amplified output signal. The predistortion modification is applied to the components to compensate for distortions introduced in the signal by the signal processing subsystem.

In a first aspect, the present invention provides a system for processing an input signal, the system comprising:
 a signal processing subsystem receiving and processing said input signal and producing a system output signal, and
 a predistortion subsystem receiving at least two internal input signals and producing at least two predistorted signals by applying a deliberate predistortion to said at least two internal input signals;

wherein
 said predistortion subsystem distorts said internal input signals to compensate for distortions in said system output signal;
 said signal processing subsystem decomposes said input signal into separate components to produce said at least two internal input signals, each of said separate components being processed separately; and
 said signal processing subsystem combines said predistorted signals after processing to produce said system output signal.

In a second aspect the present invention provides a method of processing an input signal to produce a system output signal, the method comprising:
 a) receiving said input signal
 b) decomposing said input signal into at least two component signals
 c) applying a deliberate predistortion to each of said at least two component signals to produce predistorted signals
 d) combining said at predistorted signals to produce said system output signal.

In a third aspect, the present invention provides a system for processing an input signal, the system comprising:
 a combined predistortion and decomposition subsystem, said combined subsystem receiving said input signal and producing at least two predistorted signals derived from said input signal,
 a signal processing subsystem for receiving said at least two predistorted signals from said combined subsystem, processing said at least two predistorted signals, and producing a system output signal;

wherein
 said at least two predistorted signals are predistorted components of said input signal, a predistortion of said components being to compensate for distortions in said system output signal;
 said combined subsystem decomposes said input signal into said components to produce said at least two predistorted signals, each of said separate components being processed separately; and
 said signal processing subsystem combines said predistorted signals after processing to produce said system output signal.

BRIEF DESCRIPTION OF THE DRAWINGS

A better understanding of the invention will be obtained by considering the detailed description below, with reference to the following drawings in which.

DETAILED DESCRIPTION

For clarity, the following terms are to be used with the following definitions:

AM (amplitude modulation) refers to the AM of an RF (radio frequency) signal and is equal to the magnitude of the RF signal's complex base band equivalent PM (phase modulation) refers to the PM of an RF signal and is equal to the phase of the RF signal's complex base band equivalent.

Figure 1:
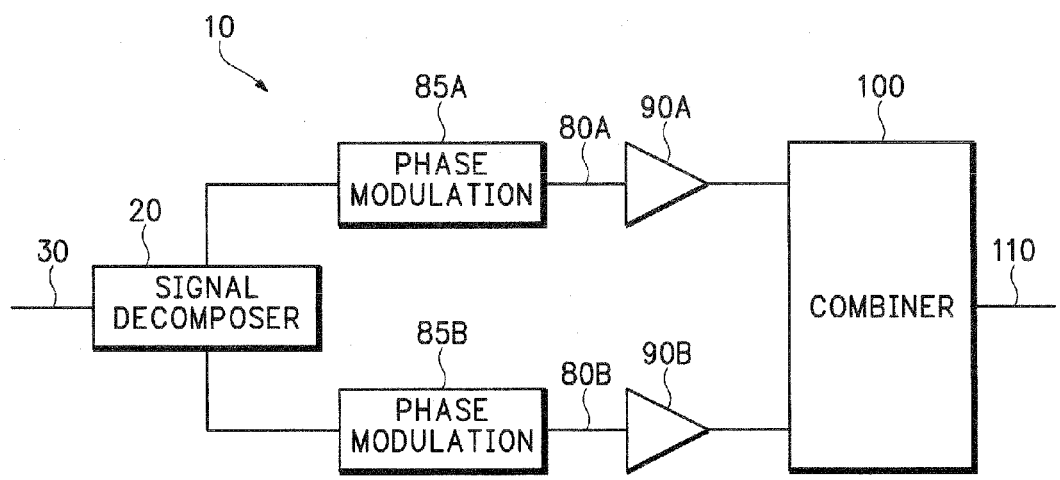
FIG. 1 is a block diagram of a Chireix architecture amplifier subsystem.

Referring to FIG. 1, a block diagram of a Chireix architecture amplifier subsystem 10 is illustrated. A signal decomposer 20 receives an input complex baseband signal 30. Phase modulated RF signals 80A, 80B are produced after the decomposed output of the decomposer 20 are phase modulated by phase modulation circuitry 85A, 85B. These phase modulated signals 80A, 80B are received by power amplifiers 90A, 90B. The phase modulated signals are thus amplified by the power amplifiers 90A, 90B and are received by a signal combiner 100. The system output signal 110 (an RF signal corresponding to the input baseband signal 30) is output from the combiner 100 and is an amplified and modulated version of the input signal 30. Phase modulation of the phase modulated signals 80A, 80B is executed after the signal decomposer 20 separates input signal 30 into at least two components. These at least two components, after phase modulation, are the signals 80A, 80B.

As noted above, the Chireix architecture has been known to introduce distortions in the system output signal 110. Part of these distortions result from he decomposition and subsequent recombining of these components. The phase fragmentation circuitry in the decomposer 20 translates a complex signal sample $x(k)=M(k) \exp(j\theta(k))$ to samples of a pair of phase signals $\alpha(k)$ and $\beta(k)$. The individual phase signals are then translated into the complex signals a(k) and b(k):

$$a(k)=\exp(j\alpha(k))/2$$

$$b(k)=\exp(p\beta(k))/2$$

For each of the complex signals a(k) and b(k), the real part of the signal is mapped to the RF (radio frequency) in-phase channel and the imaginary part of the signal is mapped to the RF quadrature channel. For ease of reference and for use in later sections of this document, it should be noted that the expression $\exp(j\alpha(k))$ is termed a phasor and that the $\alpha(k)$ alone is termed a phase angle. When the complex variable $\exp(j\alpha(k))$ is represented by a pair of variables representing the real and imaginary parts, this will be termed a vector and will be denoted by $\bar{a}(k)$.

Both signals a(k) and b(k), each having constant magnitude, are summed (by means of RF power amplification circuitry) by the combiner 100 to produce the system output signal 110. It should be noted that the factor ½ in both expressions a(k) and b(k) is a scaling factor which limits their sum to less than or equal to one (i.e. $a(k)+b(k) \leq 1$) on the assumption that $x(k) \leq 1$.

Two types of distinct decomposition and combination calculations may be used to relate the phase signals $\alpha(k)$ and $\beta(k)$ to the complex signal x(k). For brevity, we denote $x=M*\exp(j\theta)$ and the sampled RF base band equivalent of the system output signal is denoted as c(k) which corresponds to x(k) such that c(k)=x(k) if there are no impairments in the system.

The first type of decomposition is termed Magnitude Linear (ML) Decomposition and it is defined by the following equations:

Define $\phi=\cos^{-1}(M)$, then $\alpha=\theta-\phi$ and $\beta=\theta+\phi$

ML Combination:

$$c = \frac{\exp(j\alpha) + \exp(j\beta)}{2}$$

Using trigonometric identities, it can be shown that $|c|=M$ and $\angle c=\theta$ as desired. Also, since $M=\cos(\phi)$, the difference angle $$\phi = \frac{\beta - \alpha}{2},$$

corresponds to the magnitude of the signal and the sum angle $$\vartheta = \frac{\alpha + \beta}{2}$$

corresponds to the phase of the signal. For convenience, we define a phasor fragment opening angle $\Phi=2\phi$.

The second type of decomposition is termed Phase-Linear (PL) Decomposition. The Phase-Linear combination embeds a level of predistortion in the phasor fragmentation that is suitable for a combiner that provides an output magnitude that is substantially proportional to the opening angle, as opposed to a combiner that provides an output magnitude that is substantially proportional to the cosine of the opening angle. Such phasor fragmentation relieves the predistortion circuitry from linearizing the distortion effects due to the lack of the cosine characteristic in the combiner. It is believed that power amplifiers and combiners with such phase-linear characteristics have better power efficiency than those without such characteristics. Phase Linear Decomposition is defined by the following:

PL-Decomposition:

$$\phi' = \frac{\pi}{2}(1 - M),$$

then $\alpha=\theta-\phi'$, $\beta=\theta+\phi'$

PL-Combination:

$$|c| = 1 - \frac{2\phi'}{\pi}$$

and $\angle c=\theta$.

Similar to the ML Decomposition, the phasor fragment opening angle is defined as $\Phi=2\phi'$.

Figure 2A:
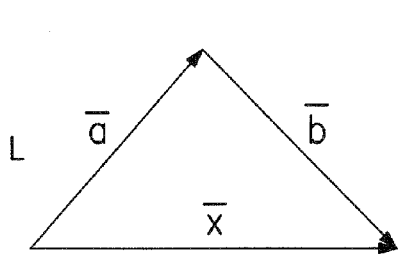
FIGS. 2A and 2B illustrate how a vector can be decomposed in two different but similar manners.
Figure 2B:
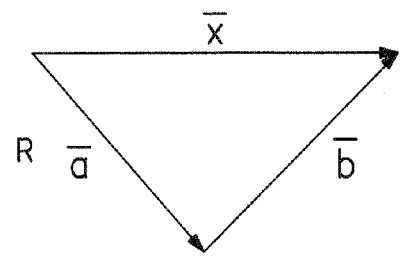

As a further refinement of the above decompositions, it should be noted that there are two possibilities for each decomposition. As is well-known, a complex number can be represented by a vector and, as shown in FIGS. 2A and 2B, this vector can be decomposed in two ways. Both FIGS. 2A and 2B illustrate how a vector $\overline{x}$ can be decomposed as the sum of two equal length vectors $\overline{a}$ and $\overline{b}$ in two different, and initially equivalent ways—a summation triangle can be formed to the left (clockwise) of $\overline{x}$ (FIG. 2A) or to the right (counterclockwise) of $\overline{x}$ (FIG. 2B).

This realization allows for the flexibility of selecting between the left or the right decomposition for any sample of x(k). Such a flexibility provides for some reduction of the power spectral density of the phase signals $\alpha(k)$ and $\beta(k)$. Such a reduction is desirable as it reduces out-of-band emissions and in-band distortions.

The distortions for which the predistortion subsystem is to compensate may come as a phase distortion, a magnitude distortion, or as a combination of both. It has been found that, without predistortion, the system output signal has an amplitude modulation (AM) envelope that is not equal to the expected and desired AM envelope. Furthermore, the phase modulation (PM) of the system output signal 110, if predistortion is not present, deviates from the expected and desired PM. Experiments have found that the AM distortion or error (magnitude distortion) of the system output signal 110 depends on the AM of the input signal. Also, it has been found that the PM distortion (or phase distortion) of the system output signal 110 depends on the AM of the input signal 30.

Figure 3A:
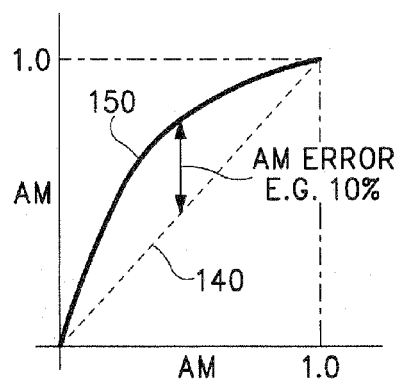
FIGS. 3A and 3B illustrate characteristics of distorted system output signals superimposed on the desired system output signal characteristics.
Figure 3B:
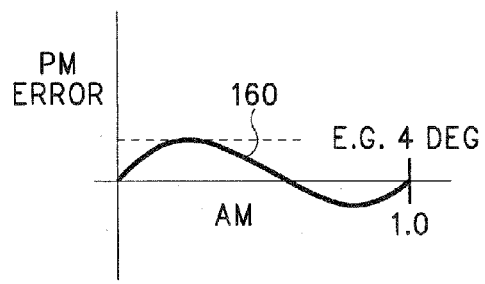

To further explain the above, FIGS. 3A, 3B are provided. As can be seen in FIG. 3A, the desired AM characteristic 140 is not followed by the resulting AM 150 of the system output signal. There is a 10% error or deviation in the middle segment of the waveform 150 from the desired AM characteristic 140. For FIG. 3B, the resulting PM 160 of the system output signal deviates from the desired PM characteristic (in this case 0°) as the AM varies. These distortion effects have been found to be caused by the Chireix architecture components.

While the above problems in distortion have been caused by the Chireix architecture, one solution is to compensate for the distortion by predistorting the input signal. As an example, if it is known that the amplifier subsystem will cause a PM distortion of x degrees at an AM of y, then predistorting the input signal by −x degrees at an AM of y should produce a system output signal with no PM distortion. The same principle can be applied for the AM distortion. If it is known that for a given input signal AM of a, the resulting system output signal will have an AM distortion of b, then predistorting the input signal in a manner which results in an output AM distortion of 0 negates the undesired effects of the AM distortion. This concept is illustrated in FIGS. 4A and 4B.

Figure 4A:
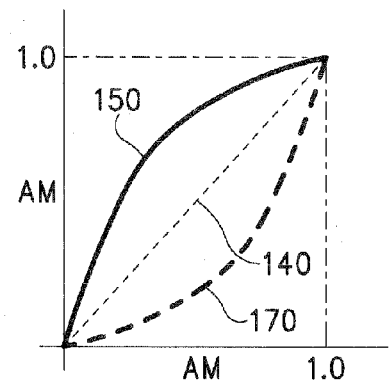
FIGS. 4A and 4B illustrate the characteristics of FIGS. 3A and 3B with characteristics of predistorted input signals.
Figure 4B:
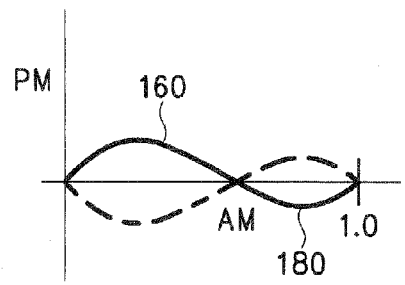

Referring to FIGS. 4A and 4B, illustrated are the desired AM predistortion output characteristic 170 and the desired PM predistortion output characteristic 180. In FIG. 4A, since the resulting AM characteristic 150 (with no predistortion) is distorted, then predistortion which results in the AM predistorted output characteristic 170 should produce the desired PM characteristic 140. Similarly, in FIG. 4B, the distortion of the resulting PM characteristic 160 (with no predistortion) can be compensated for by providing predistortion that results in a PM predistorted output characteristic 180. By specifically predistorting the input signal by the amount of the expected distortion, the resulting system output signal should be generally free of AM/AM and AM/PM distortions.

It should be noted that the predistortion modification, defined as any deliberate distortion which has been applied or is to be applied to the input signal to change at least one original characteristic of the input signal, can take many forms. Two specific types of predistortion, phase predistortion and magnitude predistortion are currently envisioned although other types are possible. These two types, separately or together, can make up the predistortion modification. In some applications, only a magnitude type predistortion modification may be required while in others only a phase type predistortion is required.

One possible source of the AM/Am and AM/PM distortion is the gain and phase imbalance between the phasor fragments.

Figure 5A:
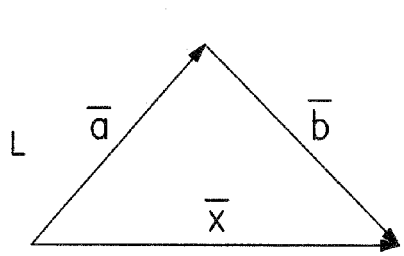
FIGS. 5A-5D illustrate the how effects of distortion is dependent on the type of decomposition used.
Figure 5C:
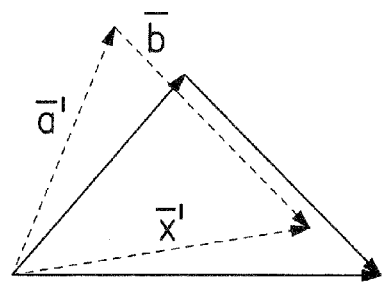
Figure 5B:
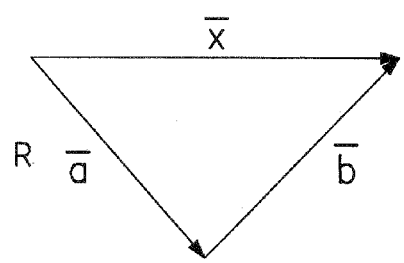

Referring to FIGS. 5A and 5B and as explained above, a vector $\overline{x}$ can be decomposed to the sum of vectors $\overline{a}$ and $\overline{b}$ in two different, and initially equivalent manners. FIG. 5A illustrates the left or clockwise decomposition while FIG. 5B illustrates the right or counterclockwise decomposition. Both summations lead to $\overline{a}+\overline{b}=\overline{x}$.

Phasor fragmentation operates under the assumption that at the point of summation the ratio between the lengths of the vectors (the magnitudes of the phasors) equals the ratio at the point of decomposition. Typically that ratio equals one, implying that both vectors are to be of equal magnitude at all times.

Any common rotation of both vectors results in a common modification of the angles and this implies a rotation of the sum $\overline{x}$. If the common rotation is constant over time, then the resulting phase rotation of the decomposed signal is not a non-linear distortion.

Figure 5D:
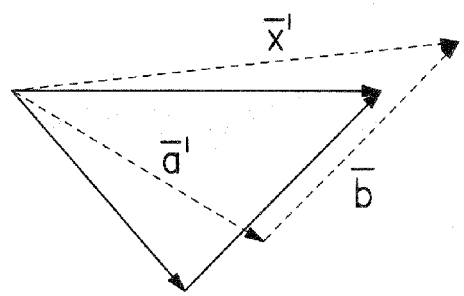

Branch imbalance between vectors $\overline{a}$ and $\overline{b}$ consists of a magnitude difference (gain imbalance) and rotation difference (phase imbalance) between the two. As an example, in FIGS. 5C and 5D, vector $\overline{a}$ is rotated to $\overline{a}'$ and while vector $\overline{b}$ remains the same. The sum is now not only caused to rotate, but the length of vector $\overline{x}$ is altered, forming a different vector $\overline{x}'$. Unfortunately, the effects of such phase imbalance is twofold: it implies magnitude distortion of the sum depending on the magnitude of the decomposed vector (AM/AM), and a constant (linear) phase distortion.

Similarly, a gain imbalance between the two vectors implies a non-linear magnitude (AM/AM) and non-linear phase (AM/PM) distortion depending on the magnitude of the decomposed vector.

Also, the effect of an imbalanced $\overline{a}'$ on the sum $\overline{x}'$ depends on the geometrical orientation of the decomposition triangle. If the left decomposition triangle is elected, a different distortion results compared to when the right decomposition triangle is elected. As a consequence of this, predistortion of such non-linear effects requires knowledge of the orientation of the decomposition triangle, and for either left or right orientation, a different pair of predistorting functions is required. These predistorting functions are denoted as the Left AM/AM predistortion function $F_L(M)$, the Left AM/PM predistortion function $G_L(M)$, the Right AM/AM predistortion function $F_R(M)$, and the Right AM/PM predistortion function $G_R(M)$. Applying a predistortion with phase and magnitude predistortion that differentiates between left and right decomposition shall be termed dual-predistortion.

Since the selection of the predistortion functions $F_L(M)$ or $F_R(M)$, and $G_R(M)$ or $G_L(M)$, depends on the orientation of the decomposition triangle for each vector $\overline{x}$ corresponding to the complex data x(k), predistortion is ideally performed after decomposition, when the elected orientation is known.

AM/AM magnitude predistortion is accomplished through modification of the opening angle $\phi$, and AM/PM phase predistortion is accomplished through modification of the resultant phase $\theta$. Consequently, predistortion can be accomplished by adjusting the angles $\alpha(k)$ and $\beta(k)$ of the phasors, in replacement of adjusting the magnitude and phase of x(k).

Two pairs of functions $A_L(M)$, $B_L(M)$ and $A_R(M)$ and $B_R(M)$, which adjust the angles $\alpha(k)$ and $\beta(k)$, are defined to additively conform $$\alpha'(k)=\alpha(k)+A_L(M(k))$$

$$\beta'(k)=\beta(k)+B_L(M(k))$$

or $$\alpha'(k)=\alpha(k)+A_R(M(k))$$

$$\beta'(k)=\beta(k)+B_R(M(k))$$

for the left and right decomposition triangles respectively.

The common contribution of the left predistorting adjustment is $$\frac{A_L(M)+B_L(M)}{2}$$

and it modifies the phase of the resultant vector based on the magnitude of x(k). The differential contribution of the left predistorting adjustment is $$\frac{A_L(M)-B_L(M)}{2}$$

and it modifies the magnitude of the resultant vector based on the magnitude of x(k). The same holds for the right adjustments respectively.

The angle adjustment functions $A_L(M)$ and $B_L(M)$ and $A_R(M)$ and $B_R(M)$ may be implemented by look up tables (LUTs) with linear interpolation.

Figure 6:
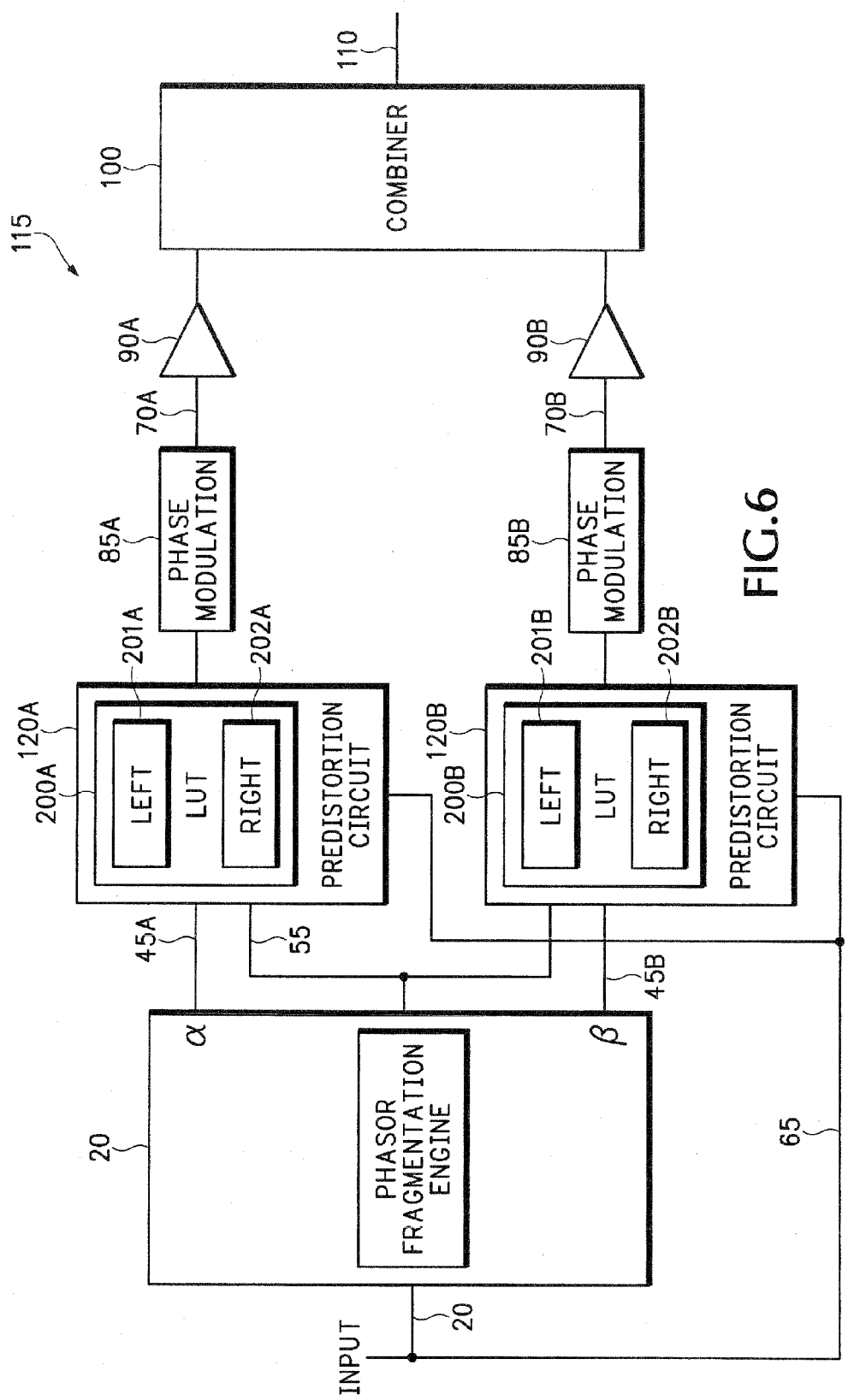
FIG. 6 is a detailed block diagram of an amplifier subsystem according to the invention.

The predistortion discussion above can be implemented in the system 115 illustrated in FIG. 6. While an analog implementation of the predistortion subsystem is possible, it has been found that a digital implementation was simpler to achieve. As can be seen in the embodiment illustrated in FIG. 6, the system 115 has a few main components: a decomposer 20, phase modulation circuitry 85A, 85B, amplifiers 90A, 90B, and a combiner 100. The predistortion subsystem consists of two predistortion circuits 120A, 120B embedded within the system 115. Each predistortion circuit 120A, 120B receives a phasor fragment 45A, 45B (also known as the internal input signals as they are internal to the system 115)) from the decomposer 20 (which includes a phasor fragmentation engine and a Cartesian to polar conversion unit) along with a signal 55 indicating whether left or right triangle decomposition was used. The predistortion subsystem then adjusts each of the received values based on the left of right triangle decomposition information 55. This adjustment is also based on a feed forward 65 from the input signal 30 to each of the predistortion circuits 120A, 120B.

Within each of the predistortion circuit blocks 120A, 120B, are lookup tables (LUTs) which are used to additively modify the received value to arrive at the desired value. The modification is determined by the predistortion circuit blocks 120A, 120B based on the value received, the feed forward 65 value, and on the left or right decomposition information 55.

The lookup tables internal to the predistortion circuit blocks 120A, 120B contain values to be added to the received $\alpha$ or $\beta$ values based on the other inputs (left or right triangle decomposition and input signal feed forward information) and the output being the predistorted signal value. Each lookup table block 200A, 200B contains dual lookup tables—a table for left decompositions (201A, 201B), and a table for right decompositions (202A, 202B). Table 201A details the values to be used for the received $\alpha$ values for a left decomposition while table 201B details the values to be used for the received $\beta$ values for a left decomposition. Similarly, table 202A contains the values to be used for the received $\alpha$ values for a right decomposition while table 202B contains the values to be used for the received $\beta$ values for a right decomposition. As an example, if table 201A in LUT block 200A has a phase adjustment value of 0.4 at an input magnitude of 0.5, then if the magnitude value received by LUT block 200A is 0.5 and if the $\alpha$ value received is 0.2 and left decomposition was used, the adjustment value of 0.4 is added to the $\alpha$ value of 0.2 to result in the adjusted $\alpha$ value of 0.6 as the output of the LUT block 200A. This value is found from table 201A due to the left decomposition. If the decomposition was a right decomposition, then table 202A would have been used to find the corrective value for the received $\alpha$ value.

Similar to the above, the table 201B in LUT block 200B is used to obtain a predistortion adjustment for the received $\beta$ value. Since the decomposition was a left decomposition, then table 201B was used. If the decomposition was a right decomposition, then table 202B would be used for the corrective value for the received $\beta$ value.

While the above described LUT performs an additive adjustment to the received $\alpha$ or $\beta$ values, other implementations are possible. Instead of an additive adjustment value, the LUT may provide a multiplicative adjustment to the received value.

It should be noted that the lookup table entries found in the lookup tables internal to the LUT block 200A, 200B may be based on experimentally derived data. As an example of how such experimentally derived data can be found, a desired output value from the amplifier subsystem 10 is first chosen. Then, the common contribution is maintained while the differential contribution is adjusted until the desired magnitude output value is achieved. Separately, while maintaining the differential contribution, the common contribution is altered until the output has a phase equal to the desired phase. The values for the common contribution are then saved for the desired phase and the value for the differential contribution is saved for the desired magnitude. These values can then be used to populate the LUTs.

To determine what value to use for the left or right triangle decomposition values, the above process can include first fixing the triangle decomposition (e.g. left), performing the above process to find the required values, and then performing the whole process again for the other triangle decomposition. This will yield the requisite values for the left and right triangle decomposition tables.

It should be noted that the above is provided merely as an example. Other methods for filling the table with the correct entries may be employed.

As an example, such lookup tables may have the following entries:

| System Input Magnitude (Right Decomposition) | Corrective Value to be Added to $\alpha$ |
|---|---|
| Magnitude1 | Phase1 |
| Magnitude2 | Phase2 |
| Magnitude3 | Phase3 |
| System Input Magnitude (Left Decomposition) | Corrective Value to be Added to $\alpha$ |
| Magnitude1 | Phase4 |
| Magnitude2 | Phase5 |
| Magnitude3 | Phase6 |

Thus, if the amplifier system detects the system input magnitude as Magnitude1 with a right triangle decomposition, then the output predistortion value should have a value of α+Phase1 and, similarly, if the system input magnitude is Magnitude2 but with a left triangle decomposition, then the output predistortion value is α+Phase5. In both cases, the a value is adjusted by Phase1 or Phase5 as the case may be. This adjusted value is fed to the phase modulation block 85A.

Phase modulation of the RF carrier in the amount of α can, for instance, be accomplished by quadrature modulation and subsequent mixing based on digital In-Phase and Quadrature signals representing the complex phasor exp(1j*α), or, for instance, by direct phase modulation of the RF carrier using RF phase modulation circuitry The phasor fragment correction concept can be further refined, if applicable, by using a polynomial to determine the required predistortion. If a mathematical relationship is found to approximate or equate the relationship between the input (such as an input magnitude) and the required predistortion to correct α and β, this mathematical relationship can be used to generate the predistortion.

It should be noted that if the adjustments for the required α or β predistorted values are not found in the lookup tables, interpolation may be used to formulate the required predistortion adjustment value. The interpolation may be linear for simplicity in implementation or it may be a more complex form of interpolation. As an example of linear interpolation, if an input magnitude value is 0.45 while the lookup table only had predistortion entries for input magnitude values of 0.4 and 0.5, then the midpoint value for the corresponding predistortion entries may be used. In this case, if the predistortion entry for an input magnitude value of 0.4 is 0.3 and the predistortion entry for an input magnitude value of 0.5 is 0.4, then the average between the two predistortion entries may be used, (i.e.(0.3+0.4)/2=0.35) as the predistortion adjustment value to be used. Of course while such simple linear interpolation may be used, more complex interpolation schemes, such as those using different weight values for different table entries, may be used.

It should also be clear that the circuit of FIG. 6 contains features relating to one embodiment of the amplifier subsystem. In FIG. 6, the signal decomposer 20 of FIG. 1 contains a phasor fragmentation engine 20A. The fragmentation engine 20A receives the input signal 30 representing the undistorted signal. The phasor fragmentation engine 20A deconstructs a predetermined modulation waveform (the undistorted signal) into signal components which are of equal magnitude as explained above. Further information regarding the phasor fragmentation engines may be found in the applicant's co-pending application U.S. application Ser. No. 10/205,743 entitled COMPUTATIONAL CIRCUITS AND METHODS FOR PROCESSING MODULATED SIGNALS HAVING NON-CONSTANT ENVELOPES, which is hereby incorporated by reference. In FIG. 6, these signal fragments or components are denoted by angles α and β. These components are each received by the predistortion circuit blocks 120A, 120B which, respectively, contain LUT blocks 200A, 200B. The predistortion circuit blocks 120A, 120B also receive the input signal 30 along with the decomposition information 45A, 45B from the decomposer 20. The output of these predistortion circuit blocks 120A, 120B are received by phase modulation and filtering blocks 60A, 60B which process the predistorted components to produce phase modulated and filtered versions of the components. The signal component 70A is an RF signal with predistorted phase a while signal component 70B is an RF signal with predistorted phase β. These components 70A, 70B are then amplified by amplifiers 90A, 90B. The amplified components are then recombined using combiner 100. Signal decomposition methods other than the phasor fragmentation referred to above may also be used by the signal decomposer 20.

Regarding the Chireix architecture amplifier subsystem 10, it has been found that, for higher amplification efficiencies, switch mode amplifiers are preferred for the amplifiers 90A, 90B. Such switch mode amplifiers, specifically Class D and Class F power amplifiers, provide low output impedances that allow higher amplification efficiencies. A co-pending application filed on Oct. 16, 2002 and having U.S. Ser. No. 10/272,725 entitled CHREIX ARCHITECTURE USING LOW IMPEDANCE AMPLIFIERS provides further information on the desirable components and is hereby incorporated by reference. Such types of amplifiers are not required for the invention to function but they have been found to provide performance at a desirable level.

It should further be noted that while there are only two parallel amplifiers 90A, 90B in FIG. 1 and FIG. 6, multiple parallel amplifiers may be used as long as the decomposer 20 decomposes the input signal 30 into enough components so that each component is separately amplified and phase modulated in parallel with the other components and as long as each component is also predistorted in parallel by multiple predistortion circuit blocks.

It should also be noted that the predistortion subsystem 10 explained above does not linearize a power amplifier as is well-known in the field. Instead, the predistortion subsystem linearizes a whole power amplifier system—the output of the whole amplifier system is linearized and not simply the output of a single amplifier. Also, unlike the linearizing systems for power amplifiers that are currently known, the amplifier system discussed in this document compensates for distortions that mostly occur at mid signal amplitudes. Current single amplifier linearization systems linearize distortions that occur at large signal amplitudes.

It should further be noted that the invention may be applied to any signal processing system which decomposes a signal into components and recombines them. It has been found that signal combiners (block 100 in FIG. 1) invariably cause distortions. These combiners use addition to recombine the components and improper signal addition, such as when recombining sinusoidal components, has been found to be one cause of the distortions in the system output signal. In the above embodiment, the phasor fragmentation engine decomposes the incoming signal into vectors and the improper addition of these vectors by the combiner 100 lead to distortions in the output signal.

Figure 7:
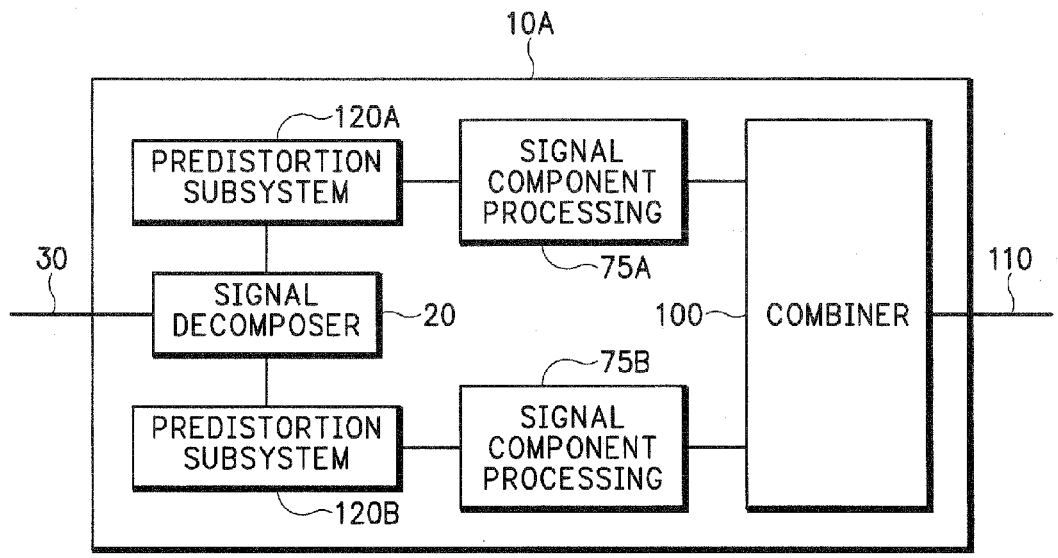
FIG. 7 is a block diagram of a generalized signal processing system according to another embodiment of the invention.

While the above embodiment amplifies the input signal, albeit separately for each component, this need not be the only signal processing accomplished after the input signal is decomposed. Referring to FIG. 7, such a generalized system 10A (which may be part of a larger signal transmission system) is illustrated. The predistortion subsystem 120 (consisting of the predistortion circuit blocks 120A, 120B) predistorts an incoming signal 30 and compensates for distortions introduced in the system output signal 110 by the improper or imperfect recombining of the input signals components. These components are produced by the signal decomposer 20 and are separately processed by signal component processor blocks 75A, 75B. The processing executed by the blocks 75A, 75B may take the form of amplification (as in the embodiment above), phase modulation, a combination of the two, or any other signal processing which may be desired. As an example, each of the signal components illustrated in FIG. 6 may be separately phase modulated in addition to being amplified by amplifiers 90A-90B.

As can be seen in FIG. 7, the signal processing subsystem 10A receives the input signal 30. After being received, the input signal 30 is decomposed by the signal decomposer 20 into components. These components are then predistorted by the predistortion subsystem 120 (composed of predistortion circuitry 120A, 120B). The predistorted components are separately processed by the signal component processor blocks 75A, 75B and are then recombined by the recombiner 100.

Figure 8:
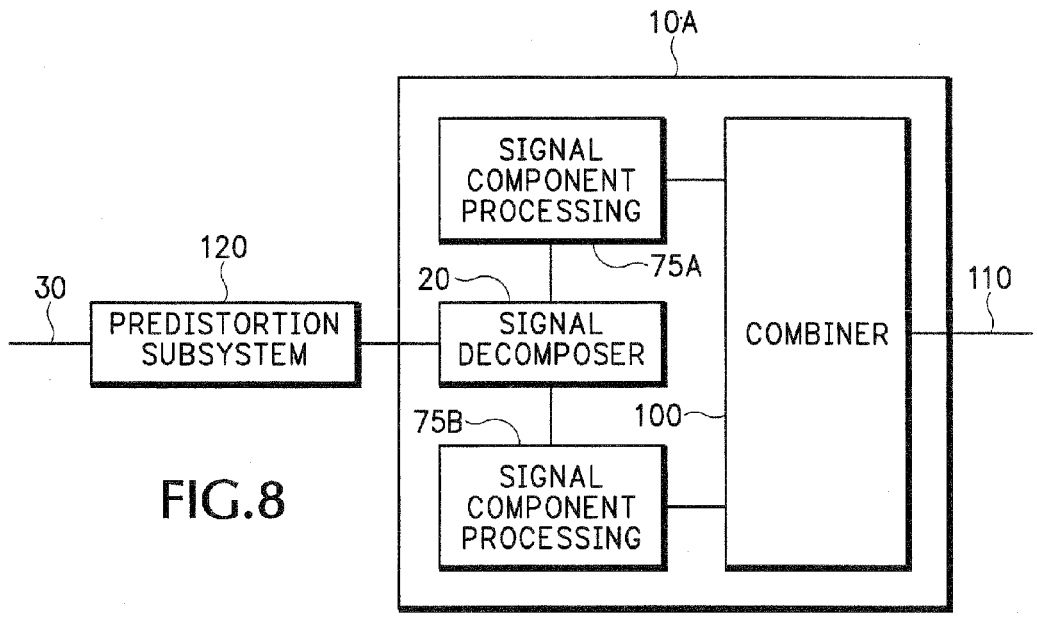
FIG. 8 is a block diagram of another configuration of a generalized signal processing system according to the invention.

Referring to FIG. 8, another configuration of the present invention is illustrated. In the generalized system of FIG. 8, the input signal is predistorted by the predistortion subsystem 120 prior to its being decomposed by the signal decomposer 20. In such a generalized system, the LUTs in the predistortion subsystem 120 are also dual LUTs in that the α and β LUTs are each equipped with two lookup tables—one for right decomposition and one for left decomposition. As can be seen, the predistortion subsystem 120 predistorts an incoming signal 30 and compensates for distortions introduced in the system output signal 110 by the improper or imperfect recombining of the input signals components. These components are produced by the signal decomposer 20 and are separately processed by signal component processor blocks 75A, 75B. The processing executed by the blocks 75A, 75B may take the form of amplification (as in the embodiment above), phase modulation, a combination of the two, or any other signal processing which may be desired.

One advantage using the above invention is that it allows less stringent tolerances to be used for the system components. Previously, components had to be substantially matched so that signal processing could produce acceptable results. By using the above invention, less than substantially matched components may be used together. Errors due to a mismatch may be measured and compensated for by the predistortion subsystem.

A person understanding this invention may now conceive of alternative structures and embodiments or variations of the above all of which are intended to fall within the scope of the invention as defined in the claims that follow.

What is claimed is:

1. A system for processing an input signal, the system comprising:
   a signal processing subsystem receiving and processing said input signal and producing a system output signal, and
   a predistortion subsystem receiving at least two internal input signals and producing at least two predistorted signals by applying a deliberate predistortion to said at least two internal input signals; wherein
   said predistortion subsystem distorts said internal input signals to compensate for distortions in said system output signal;
   said signal processing subsystem decomposes said input signal into separate components to produce said at least two internal input signals, each of said separate components being processed separately; and
   said signal processing subsystem combines said predistorted signals after processing to produce said system output signal.

2. A system according to claim 1 wherein said signal processing subsystem comprises:
   a signal decomposer for decomposing said predistorted signal into at least two internal input signals;
   at least two signal component processor blocks, each signal processor block receiving an output of said predistortion subsystem and each signal processor block separately processes said output received from said predistortion subsystem; and
   a combiner receiving a processed output from each of said at least two signal component processor blocks, said combiner producing said system output signal from said processed outputs of said at least two signal component processor blocks.

3. A system according to claim 2 wherein at least one of said at least two signal component processor blocks includes an amplifier.

4. A system according to claim 3 wherein said amplifier is a non-liner amplifier.

5. A system according to claim 1 wherein said system is part of a signal transmission system.

6. A system according to claim 1 wherein at least some of said distortions are due to said combiner.

7. A system according to claim 3 wherein said amplifier is a switch mode amplifier.

8. A system according to claim 3 wherein said amplifier has a low output impedance.

9. A system according to claim 1 wherein said deliberate predistortion adjusts a phase of said system output signal by adjusting at least one of said at least two internal input signals.

10. A system according to claim 1 wherein said deliberate predistortion adjusts a magnitude of said system output signal by adjusting at least one of said at least two internal input signals.

11. A system according to claim 1 wherein said deliberate predistortion is based on at least one entry in a lookup table.

12. A method of processing an input signal to produce a system output signal, the method comprising:
   a) receiving said input signal
   b) decomposing said input signal into at least two component signals
   c) applying a deliberate predistortion to each of said at least two component signals to produce predistorted signals
   d) combining said at predistorted signals to produce said system output signal.

13. A method according to claim 12 wherein said system output signal is an RF modulated version of said input signal.

14. A method according to claim 12 further including a processing step of separately processing each of said predistorted signals prior to step d).

15. A method according to claim 14 wherein said processing step includes amplifying at least one of said predistorted signals.

16. A method according to claim 14 wherein said processing step includes phase modulating at least one of said predistorted signals.

17. A method according to claim 12 wherein step c) further includes the step of accessing an entry in a lookup table, said deliberate predistortion being based on said entry.

18. A method according to claim 17 wherein said deliberate predistortion is based on an interpolation of entries in said table.

19. A system according to claim 11 wherein said deliberate predistortion is based on an interpolation of entries in said table.

20. A system according to claim 1 wherein at least one of said at least two internal signals represents an angle.

21. A method according to claim 12 wherein at least one of said at least two internal component signals represents an angle.

22. A method according to claim 12 wherein said deliberate predistortion adjusts a phase of said system output signal by adjusting at least one of said at least two component signals.

23. A method according to claim 12 wherein said deliberate predistortion adjusts a magnitude of said system output signal by adjusting at least one of said at least two component signals.

24. A system according to claim 1 wherein said predistortion subsystem processes said at least two internal signals based on how said signal processing subsystem decomposes said input signal.

25. A system according to claim 1 wherein said signal processing subsystem decomposes said input signal using either a left triangle decomposition or a right triangle decomposition.

26. A system according to claim 25 wherein said deliberate predistortion applied to said at least two internal input signals depend upon a type of decomposition used by said signal processing subsystem.

27. A method according to claim 12 wherein said deliberate predistortion is dependent upon a type of decomposition used in step b).

28. A method according to claim 12 wherein said input signal is decomposed using either a left triangle decomposition or a right triangle decomposition.

29. A method according to claim 28 wherein said deliberate predistortion is dependent upon a type of decomposition used in step b).

30. A system according to claim 1 wherein said predistortion subsystem separately distorts said internal input signals.

31. A system for processing an input signal, the system comprising:
 a combined predistortion and decomposition subsystem, said combined subsystem receiving said input signal and producing at least two predistorted signals derived from said input signal,
 a signal processing subsystem for receiving said at least two predistorted signals from said combined subsystem, processing said at least two predistorted signals, and producing a system output signal; wherein
 said at least two predistorted signals are predistorted components of said input signal, a predistortion of said components being to compensate for distortions in said system output signal;
 said combined subsystem decomposes said input signal into said components to produce said at least two predistorted signals, each of said separate components being processed separately; and
 said signal processing subsystem combines said predistorted signals after processing to produce said system output signal.

32. A system according to claim 31 wherein said combined subsystem utilizes different processing for said input signal based on a decomposition method used.

33. A system according to claim 32 wherein said combined subsystem contains multiple lookup tables for use in producing said predistorted components such that said decomposition method used determines which lookup tables are utilized.

34. A system according to claim 33 wherein said combined subsystem predistorts said input signal prior to decomposing a resulting predistorted signal to produce said at least two predistorted signals.

35. A system according to claim 33 wherein said combined subsystem decomposes said input signal prior to predistorting resulting components to produce said at least two predistorted signals.

36. A system according to claim 33 wherein said decomposition method is selected from a group including left triangle decomposition and right triangle decomposition.

* * * * *

UNITED STATES PATENT AND TRADEMARK OFFICE
CERTIFICATE OF CORRECTION

PATENT NO. : 7,409,193 B2
APPLICATION NO. : 10/641370
DATED : August 5, 2008
INVENTOR(S) : Aryan Saed It is certified that error appears in the above-identified patent and that said Letters Patent is hereby corrected as shown below:

At column 1, line 3, please insert --CROSS-REFERENCE TO RELATED APPLICATIONS--.

At column 12, line 4, please delete "non-liner" and insert --non-linear--.

Signed and Sealed this

Thirty-first Day of August, 2010

David J. Kappos
*Director of the United States Patent and Trademark Office*